United States Patent
Ker et al.

(10) Patent No.: US 7,667,936 B2
(45) Date of Patent: Feb. 23, 2010

(54) HIGH-VOLTAGE TOLERANT POWER-RAIL ESD CLAMP CIRCUIT FOR MIXED-VOLTAGE I/O INTERFACE

(75) Inventors: Ming-Dou Ker, Hsinchu (TW); Wen-Yi Chen, Hsinchu (TW); Che-Hao Chuang, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 12/134,061

(22) Filed: Jun. 5, 2008

(65) Prior Publication Data

US 2008/0232013 A1 Sep. 25, 2008

Related U.S. Application Data

(62) Division of application No. 11/366,143, filed on Mar. 2, 2006, now Pat. No. 7,397,280.

(51) Int. Cl.
*H02H 3/20* (2006.01)
*H02H 3/22* (2006.01)
*H02H 9/04* (2006.01)

(52) U.S. Cl. .................. 361/56; 361/111; 361/91.1

(58) Field of Classification Search ............... 361/56, 361/111, 91.1
See application file for complete search history.

(56) References Cited

U.S. PATENT DOCUMENTS

| | | | |
|---|---|---|---|
| 6,954,098 B2* | 10/2005 | Hsu et al. | 327/313 |
| 7,221,551 B2* | 5/2007 | Chen | 361/230 |
| 2002/0159208 A1* | 10/2002 | Ker et al. | 361/56 |
| 2004/0218322 A1* | 11/2004 | Chen et al. | 361/56 |
| 2005/0200396 A1* | 9/2005 | Hsu et al. | 327/313 |

* cited by examiner

*Primary Examiner*—Stephen W Jackson
*Assistant Examiner*—Zeev Kitov
(74) *Attorney, Agent, or Firm*—Alston & Bird LLP

(57) ABSTRACT

A circuit for electrostatic discharge (ESD) protection includes a resistor a capacitor connected in series with the resistor, a first transistor including a gate, the gate being connected to a first power supply providing a first voltage to the gate via the resistor and a first terminal connected to the first power supply, a second transistor including a gate, the gate being connected to a second power supply, the second power supply providing a second voltage smaller than the first voltage, the second transistor having a first terminal connected to a second terminal of the first transistor, and a third transistor including a gate, the gate being connected to the second power supply, a first terminal of the third transistor being connected to a second terminal of the second transistor, and a second terminal being connected to a reference voltage different from the first voltage and the second voltage.

14 Claims, 12 Drawing Sheets

HIGH-VOLTAGE TOLERANT POWER-RAIL ESD CLAMP CIRCUIT FOR MIXED-VOLTAGE I/O INTERFACE

CROSS-REFERENCE TO RELATED APPLICATIONS

This application is related to and hereby claims priority to U.S. patent application Ser. No. 11/366,143, filed Mar. 2, 2006, incorporated herein by reference.

BACKGROUND OF THE INVENTION

The present invention relates generally to electrostatic discharge ("ESD") protection, and more particularly, to an ESD clamp circuit for a mixed-voltage input/output ("I/O") interface.

Electrostatic discharge (ESD) is a phenomenon that poses a deadly threat to the integrated circuit (IC). A typical ESD event—for instance, when you rub your feet on a carpet and touch a conductive object—can easily destroy a semiconductor device. Strictly speaking, ESD is a rapid discharge event that transfers a finite amount of charge between two bodies at different potentials. The damage caused on an IC depends on the current densities and voltage gradients developed during the event.

ESD damage has become the main reliability issue for complementary metal-oxide-semiconductor ("CMOS") integrated circuit ("IC") products fabricated in nanoscale CMOS processes. In a nanoscale IC, the thickness of gate oxide films is reduced as the geometry of the IC is reduced, resulting in a decrease in the operating voltage required for internal circuits and in turn, the power consumption.

In an electronic system having multiple sub-systems, such as in a computer system, there are generally a plurality of power supplies providing different power levels. The sub-systems, such as ICs and chips in the system often require different power supply voltages. Therefore, to be compatible with different power supply voltages, the operating voltage at the input/output (I/O) interfaces of an IC may be greater than the operating voltage of the IC. For example, in an IC fabricated by a 0.18-μm CMOS process, the internal circuits operate at a power supply voltage of approximately 1.8V (volts), while the I/O devices may operate at a power supply voltage of approximately 3.3V, or transmit or receive signals having a voltage level of 3.3V in a mixed-voltage system. To avoid an excessive electrical field due to an excessive voltage applied across nodes of the I/O device, which may cause degradation or breakdown of the gate oxides, in a conventional method, I/O devices are fabricated with a relatively thick gate oxide so as to sustain the excessive voltage. However, such a conventional method decreases the product yield and requires an additional mask in the manufacturing process, resulting in an increase in the product cost.

A feasible way of solution is required to maintain the electrical property and device geometry in nanoscale CMOS ICs without compromising the product yield and throughput. Such a solution may be implemented in circuitry. It is therefore desirable to have an ESD clamp circuit that is able to quickly respond to an ESD event to protect an internal circuit without affecting the operation of the internal circuit to during a normal condition.

BRIEF SUMMARY OF THE INVENTION

The present invention is directed to an ESD clamp circuit and a method of providing ESD protection that obviate one or more problems resulting from the limitations and disadvantages of the prior art.

In accordance with an embodiment of the present invention, there is provided a circuit for electrostatic discharge (ESD) protection includes a resistor a capacitor connected in series with the resistor, a first transistor including a gate, the gate being connected to a first power supply providing a first voltage to the gate via the resistor and a first terminal connected to the first power supply, a second transistor including a gate, the gate being connected to a second power supply, the second power supply providing a second voltage smaller than the first voltage, the second transistor having a first terminal connected to a second terminal of the first transistor, and a third transistor including a gate, the gate being connected to the second power supply, a first terminal of the third transistor being connected to a second terminal of the second transistor, and a second terminal being connected to a reference voltage different from the first voltage and the second voltage.

Also in accordance with the present invention, there is provided a circuit for electrostatic discharge (ESD) protection that comprises a voltage coupling device including a first terminal connected to a first power supply providing a first voltage, a first transistor including a gate connected to a second terminal of the voltage coupling device and a first terminal connected to the first power supply, a second transistor including a gate connected to a second power supply providing a second voltage smaller than the first voltage, and a first terminal connected to the gate of the first transistor, a third transistor including a gate connected to a second terminal of the second transistor, and a first terminal connected to a second terminal of the first transistor, and a fourth transistor including a gate connected to the second power supply, a first terminal connected to the gate of the third transistor, and a second terminal connected to a reference voltage different from the first voltage and the second voltage.

Further in accordance with the present invention, there is provided a circuit for electrostatic discharge (ESD) protection that comprises a voltage divider circuit connected between a first power supply providing a first voltage and a reference voltage, a first transistor including a gate connected to a terminal of the voltage divider circuit and a first terminal connected to the first power supply, a second transistor including a gate connected to a second power supply providing a second voltage smaller than the first voltage, and a first terminal connected to the gate of the first transistor, a third transistor including a gate connected to a second terminal of the second transistor, and a first terminal connected to a second terminal of the first transistor, and a fourth transistor including a gate connected to the second power supply, a first terminal connected to the gate of the third transistor, and a second terminal connected to a reference voltage different from the first voltage and the second voltage.

Still in accordance with the present invention, there is provided a method of providing electrostatic discharge (ESD) protection that comprises providing a delay circuit, providing a first transistor including a gate connected to the delay circuit and a first terminal connected to a first power supply providing a first voltage, providing a second transistor including a gate connected to a second power supply providing a second voltage smaller than the first voltage, and a first terminal connected to a second terminal of the first transistor, providing a third transistor including a gate connected to the second power supply, a first terminal connected to a second terminal of the second transistor, and a second terminal connected to a reference voltage different from the first voltage and the second voltage, forming a parasitic resistor between the second terminal of the second transistor and the reference voltage, and conducting an ESD current from the first power supply via the parasitic resistor to the reference voltage.

Yet still in accordance with the present invention, there is provided a method of providing electrostatic discharge (ESD) protection that comprises providing a voltage coupling device including a first terminal connected to a first power supply providing a first voltage, providing a first transistor including a gate connected to a second terminal of the voltage coupling device and a first terminal connected to the first power supply, providing a second transistor including a gate connected to a second power supply providing a second voltage smaller than the first voltage, and a first terminal connected to the gate of the first transistor, providing a third transistor including a gate connected to a second terminal of the second transistor, and a first terminal connected to a second terminal of the first transistor, providing a fourth transistor including a gate connected to the second power supply, a first terminal connected to the gate of the third transistor, and a second terminal connected to a reference voltage different from the first voltage and the second voltage, forming a parasitic resistor between a second terminal of the third transistor and the reference voltage, and coupling a portion of an ESD pulse through the voltage coupling device to the first transistor in response to an ESD event.

Further in accordance with the present invention, there is provided a method of providing electrostatic discharge (ESD) protection that comprises providing a voltage divider circuit connected between a first power supply providing a first voltage and a reference voltage, providing a first transistor including a gate connected to a terminal of the voltage divider circuit and a first terminal connected to the first power supply, providing a second transistor including a gate connected to a second power supply providing a second voltage smaller than the first voltage, and a first terminal connected to the gate of the first transistor, providing a third transistor including a gate connected to a second terminal of the second transistor, and a first terminal connected to a second terminal of the first transistor, providing a fourth transistor including a gate connected to the second power supply, a first terminal connected to the gate of the third transistor, and a second terminal connected to a reference voltage different from the first voltage and the second voltage, and biasing the gate of the first transistor at a divided portion of the first voltage to keep the first transistor at an off state.

Additional features and advantages of the present invention will be set forth in part in the description which follows, and in part will be obvious from the description, or may be learned by practice of the invention. The features and advantages of the invention will be realized and attained by means of the elements and combinations particularly pointed out in the appended claims.

It is to be understood that both the foregoing general description and the following detailed description are exemplary and explanatory only and are not restrictive of the invention, as claimed.

BRIEF DESCRIPTION OF THE SEVERAL VIEWS OF THE DRAWINGS

The foregoing summary, as well as the following detailed description of the invention, will be better understood when read in conjunction with the appended drawings. For the purpose of illustrating the invention, there are shown in the drawings embodiments which are presently preferred. It should be understood, however, that the invention is not limited to the precise arrangements and instrumentalities shown.

In the drawings.

DETAILED DESCRIPTION OF THE INVENTION

Reference will now be made in detail to the present embodiments of the invention, examples of which are illustrated in the accompanying drawings. Wherever possible, the same reference numbers will be used throughout the drawings to refer to the same or like parts.

Figure 1:
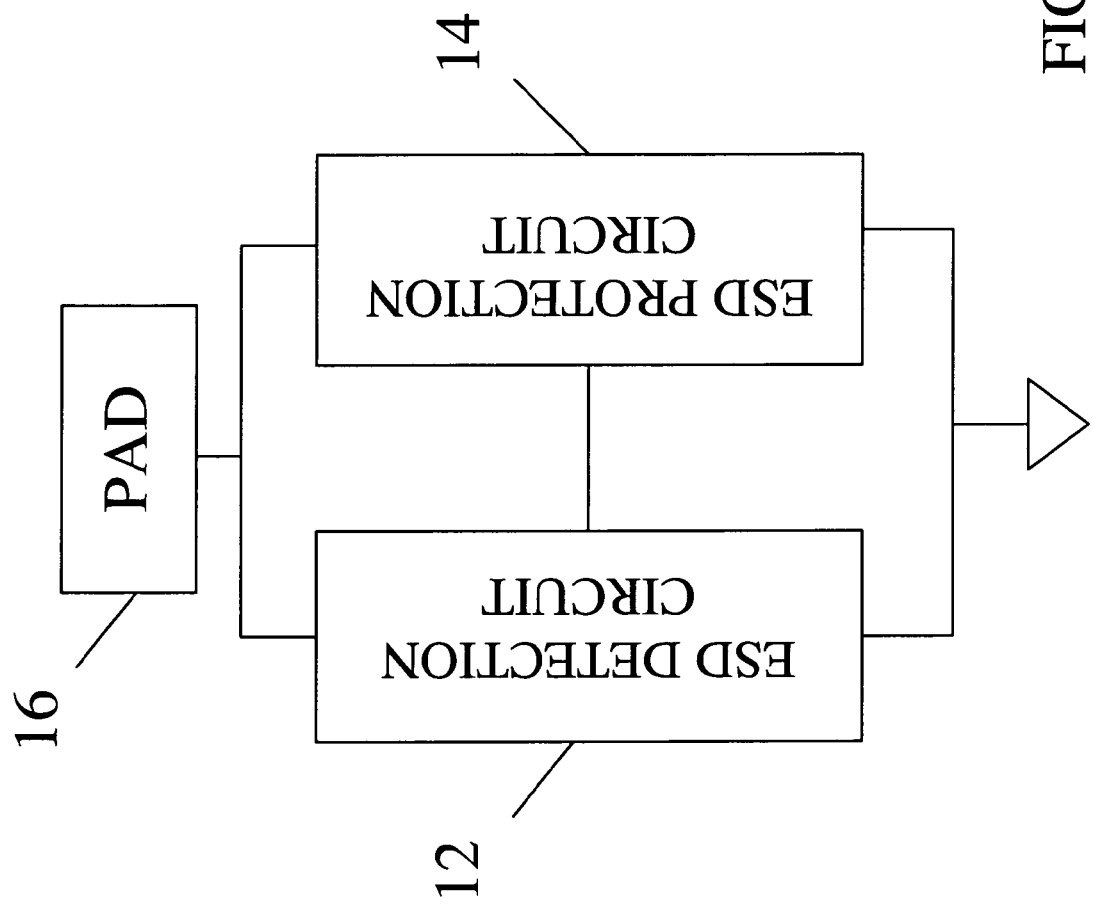
FIG. 1 is a schematic block diagram of an electrostatic discharge ("ESD") clamp circuit in accordance with one embodiment of the present invention.

FIG. 1 is a schematic block diagram of an electrostatic discharge ("ESD") clamp circuit in accordance with one embodiment of the present invention. Referring to FIG. 1, the ESD clamp circuit includes an ESD detection circuit 12 and an ESD protection circuit 14, each of which are connected to an internal circuit or circuits to be protected (not shown) at a pin or a pad 16. The ESD detection circuit 12 is kept in an off state during normal operation of internal circuit. When an ESD event occurs, for example, at the pin or pad 16 of the ESD clamp circuit, the ESD detection circuit 12 triggers the ESD protection circuit 14 to provide ESD protection for the internal circuit or circuits. Based on a substrate-triggered design, which has been disclosed in "Investigation of the Gate-Driven Effect and Substrate-Triggered Effect on ESD Robustness of CMOS Devices" by T. Y. Chen and M. D. Ker, IEEE Trans. Device and Materials Reliability, vol. 1, pp. 190-203, December 2001, the ESD detection circuit 12 provides a triggered current in response to an ESD event to quickly and uniformly turn on the ESD protection circuit 14.

Figure 2:
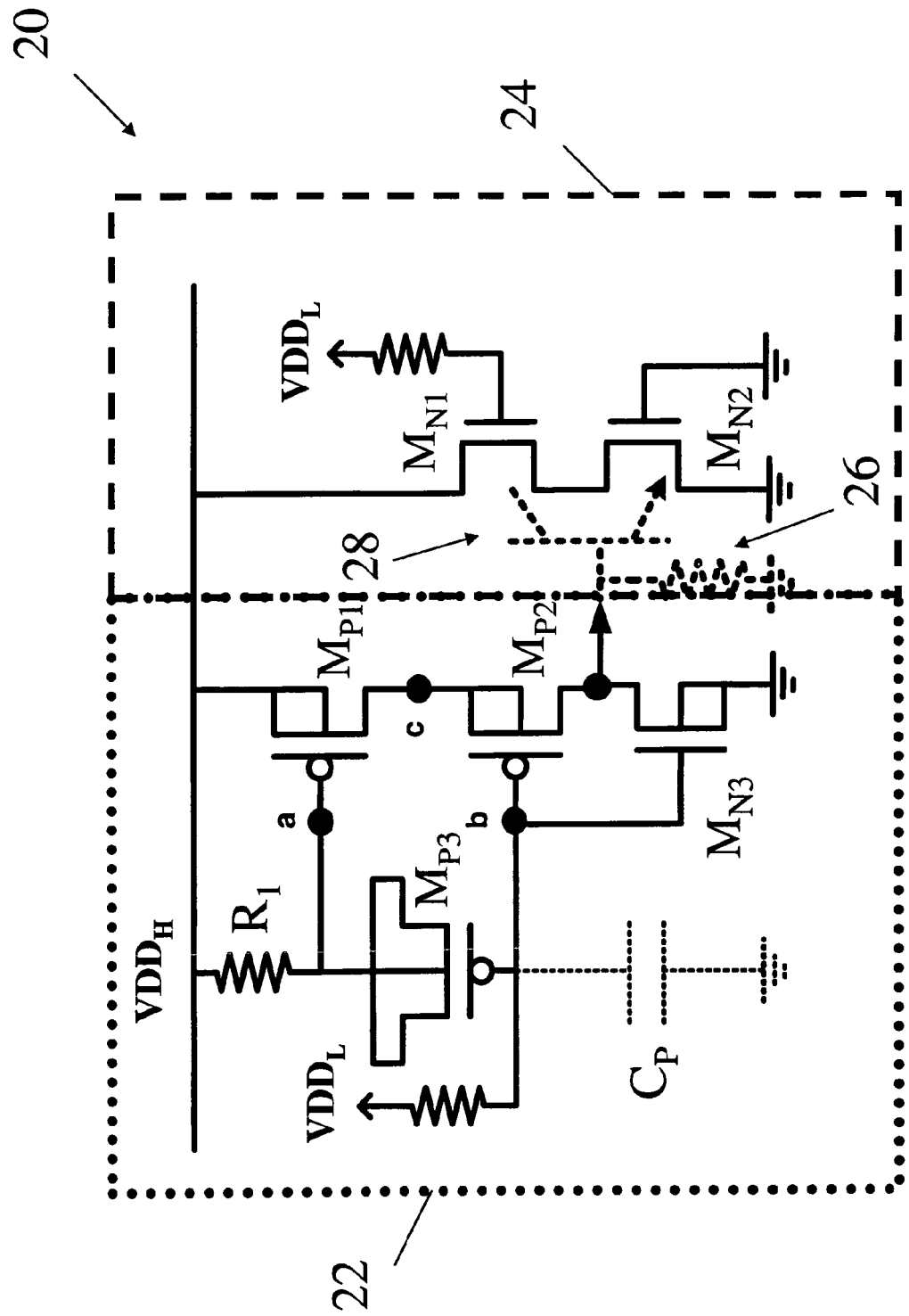
FIG. 2 is a circuit diagram of an ESD clamp circuit in accordance with one embodiment of the present invention.

FIG. 2 is a circuit diagram of an ESD clamp circuit 20 in accordance with a first preferred embodiment of the present invention. Referring to FIG. 2, the ESD clamp circuit 20 includes an ESD detection circuit 22 and an ESD protection circuit 24. ESD protection circuit 24 includes but is not limited to one of a stacked n-type metal-oxide-semiconductor ("STNMOS") device, a silicon controlled rectifier ("SCR") device or a field oxide device ("FOD"), which is able to sustain approximately two times of the operation voltage level required for the internal circuits to be protected by ESD clamp circuit 20. For the purpose of illustration, an STNMOS device is used as ESD protection circuit 24 throughout the specification. ESD clamp circuit 20 operates in a mixed-voltage environment including a first power supply $VDD_H$, and a second power supply $VDD_L$ which is used for powering the internal circuits. The maximum operation voltage level of the first power supply $VDD_H$ is preferably approximately two times of that of the second power supply $VDD_L$. A capacitance, denoted as $C_P$, represents an equivalent parasitic capacitance of the integrated circuit ("IC") comprising ESD clamp circuit 20.

ESD detection circuit 22 includes a first p-type metal-oxide-semiconductor ("PMOS") transistor $M_{P1}$, a second PMOS transistor $M_{P2}$, a third PMOS transistor $M_{P3}$ and an n-type metal-oxide-semiconductor ("NMOS") transistor $M_{N3}$. The first PMOS transistor $M_{P1}$ includes a gate (not numbered) coupled to the first power supply $VDD_H$ through a resistor $R_1$, and a source (not numbered) coupled to the first power supply $VDD_H$. The second PMOS transistor $M_{P2}$ includes a source (not numbered) coupled to a drain (not numbered) of the first PMOS transistor $M_{P1}$, and a gate (not numbered) coupled to a gate (not numbered) of the third PMOS transistor $M_{P3}$ and the second power supply $VDD_L$. The third PMOS transistor $M_{P3}$, which serves as a capacitor and may be replaced with a capacitor in other embodiments, forms an RC delay circuit with the resistor $R_1$. The NMOS transistor $M_{N3}$ includes a gate (not numbered) coupled to the gate of the second PMOS transistor $M_{P2}$, a drain (not numbered) coupled to a drain of the second PMOS transistor $M_{P2}$, and a source (not numbered) coupled to a reference voltage level.

ESD protection circuit 24, in the form of an STNMOS device, includes a first NMOS transistor $M_{N1}$ and a second NMOS transistor $M_{N2}$. A parasitic resistor 26 and a parasitic npn transistor 28 are formed in ESD protection circuit 24 during fabrication of the STNMOS device. The first NMOS transistor $M_{N1}$ includes a gate (not numbered) coupled to the second power supply $VDD_L$, and a drain (not numbered) coupled to the first power supply $VDD_H$. The second NMOS transistor $M_{N2}$ includes a gate (not numbered) and a source (not numbered) coupled to the reference voltage level, and a drain (not numbered) coupled to a source (not numbered) of first NMOS transistor $M_{N1}$.

During normal operations of the IC, the voltage level at a point a, i.e., Va, is biased at $VDD_H$ through the resistor $R_1$, which turns off the first PMOS transistor $M_{P1}$. The voltage level at a point c, i.e., Vc, is biased at approximately ($VDD_L$+ |Vtp|), where Vtp is a threshold voltage of the second PMOS transistor $M_{P2}$. The NMOS transistor $M_{N3}$, even though turned on by a voltage level of $VDD_L$ applied at a point b, i.e., Vb being $VDD_L$, does not draw any drain current because no current is provided from the PMOS transistors $M_{P1}$ and $M_{P2}$. As a result, ESD detection circuit 22 is kept at an off state and does not affect the normal operations of the IC. Since $VDD_L$ is equal to approximately ½ $VDD_H$, the drain-to-gate, gate-to-source and gate-to-bulk voltages of each of the transistors, $M_{P1}$, $M_{P2}$ and $M_{N3}$ are smaller than $VDD_L$. Because, a CMOS device may sustain an electrical field resulting from a voltage level being 1.1 times its normal operation voltage, i.e., 1.1 $VDD_L$ in the present, the ESD clamp circuit 20 does not incur any gate oxide reliability issue.

As far as a power-on transition is concerned, since the normal rise time of a power supply voltage is in the order of several milliseconds (ms), the values of the resistor $R_1$ and the third PMOS transistor $M_{P3}$ are selected such that the voltage Va rises with the power signal during the power-on transition without generating any RC delay, ensuring that ESD detection circuit 22 is kept at an off state. On the other hand, as far as an ESD event is concerned, since the rise time of an ESD signal ranges from several to several tens of nanoseconds (ns), the values of the resistor $R_1$ and the third PMOS transistor $M_{P3}$ are selected such that the voltage Va rises slowly to ensure that the delay circuit formed by the resistor $R_1$ and the third PMOS transistor $M_{P3}$ generates an RC delay. In one embodiment according to the present invention, the RC delay ranges from approximately 0.1 to 1 microseconds (µs) but could be other values.

In response to an ESD event, the voltage Va, due to the RC delay, is relatively small as compared to $VDD_H$, thus turning on the first PMOS transistor $M_{P1}$. Since during an ESD event an IC is generally floating, the second power supply $VDD_L$ may be deemed a ground voltage level, 0V. The second PMOS transistor $M_{P2}$ therefore is deemed to be at an on state and the NMOS transistor $M_{N3}$ is at an off state. When an ESD event occurs on first power supply $VDD_H$, a triggered current is provided from the PMOS transistors $M_{P1}$ and $M_{P2}$ to the base (not numbered) of the STNMOS device, then to the ground through the parasitic resistor 26, which turns on parasitic npn transistor 28 and in turn ESD protection circuit 24. The ESD current is then discharged to ground through parasitic npn transistor 28.

Figures 3A, 3B:
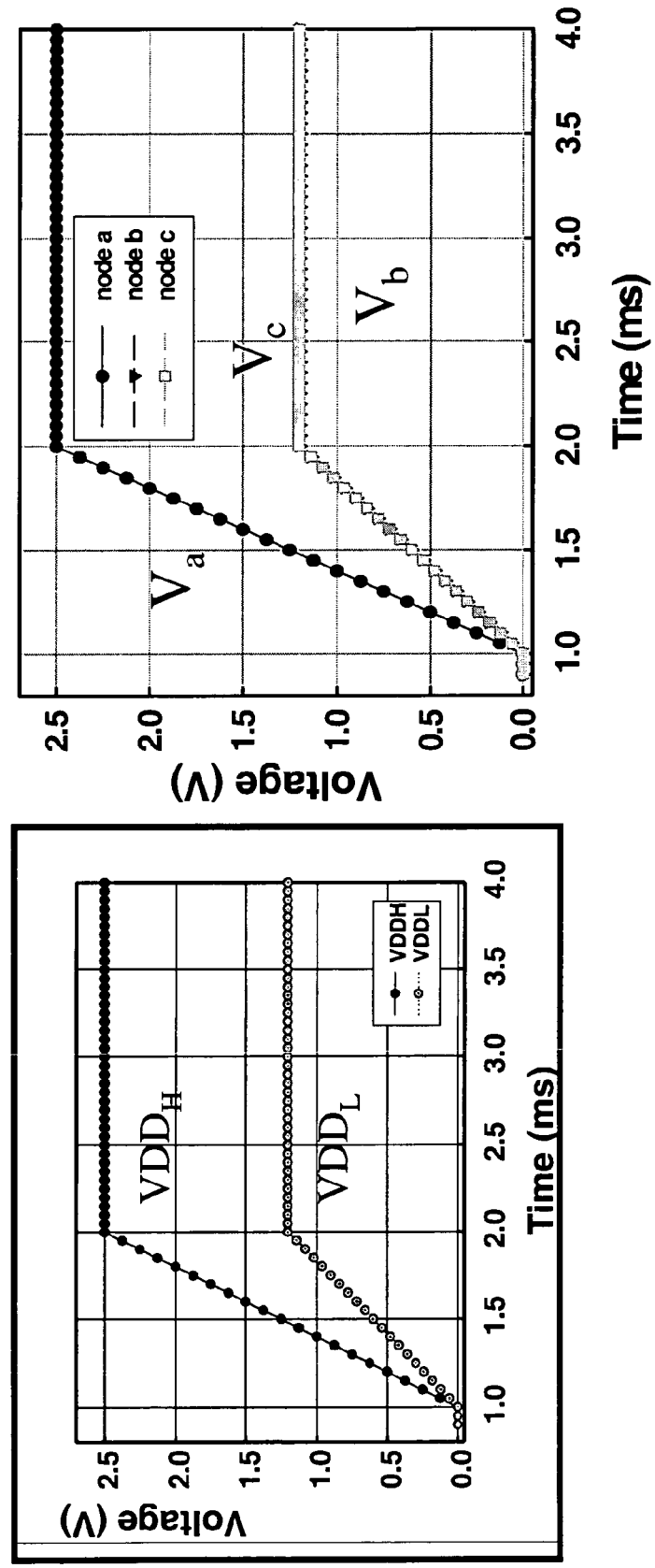
FIGS. 3A and 3B are plots illustrating the simulation results of the ESD clamp circuit shown in FIG. 2 operating at a normal condition.

FIGS. 3A, 3B and FIGS. 4A, 4B illustrate voltage or current responses in ESD clamp circuit 20, which are obtained by SPICE simulation. FIGS. 3A and 3B are plots illustrating the simulation results of the ESD clamp circuit 20 shown in FIG. 2 operating at a normal condition. Referring to FIG. 3A, simulated $VDD_H$ and $VDD_L$ signals have a value of approximately 2.5V and 1.2V, respectively, with a rise time of approximately 1 ms. FIG. 3B illustrates the voltage responses at the points a, b and c shown in FIG. 2 during power-on transition. Referring to FIG. 3B, the voltage Va substantially rises to the $VDD_H$ level in 1 ms during a power-on transition, which turns off the first PMOS transistor $M_{P1}$ and in turn ESD detection circuit 22.

Figure 4A:
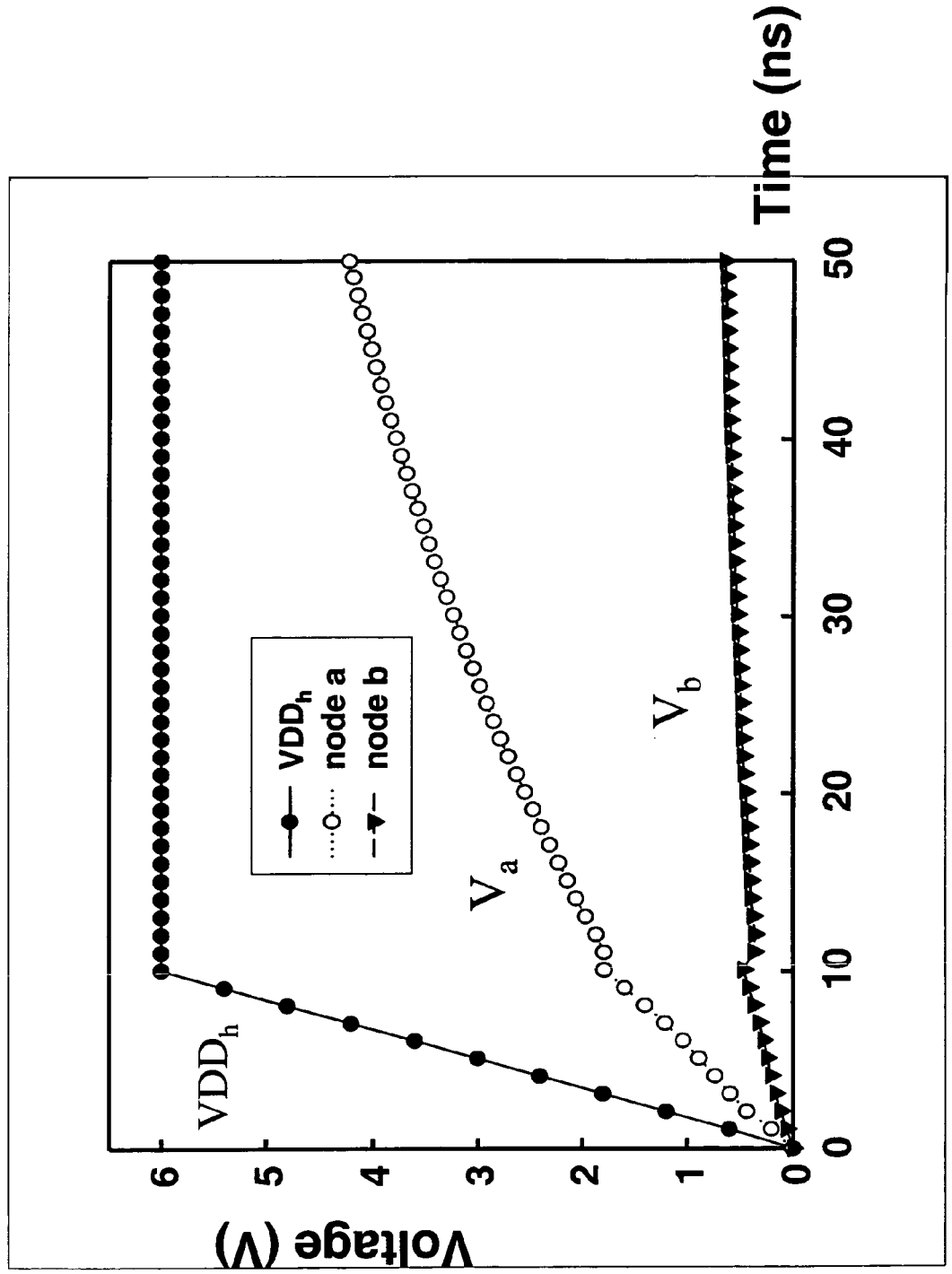
FIGS. 4A and 4B are plots illustrating the simulation results of the ESD clamp circuit shown in FIG. 2 operating in response to an ESD event.
Figure 4B:
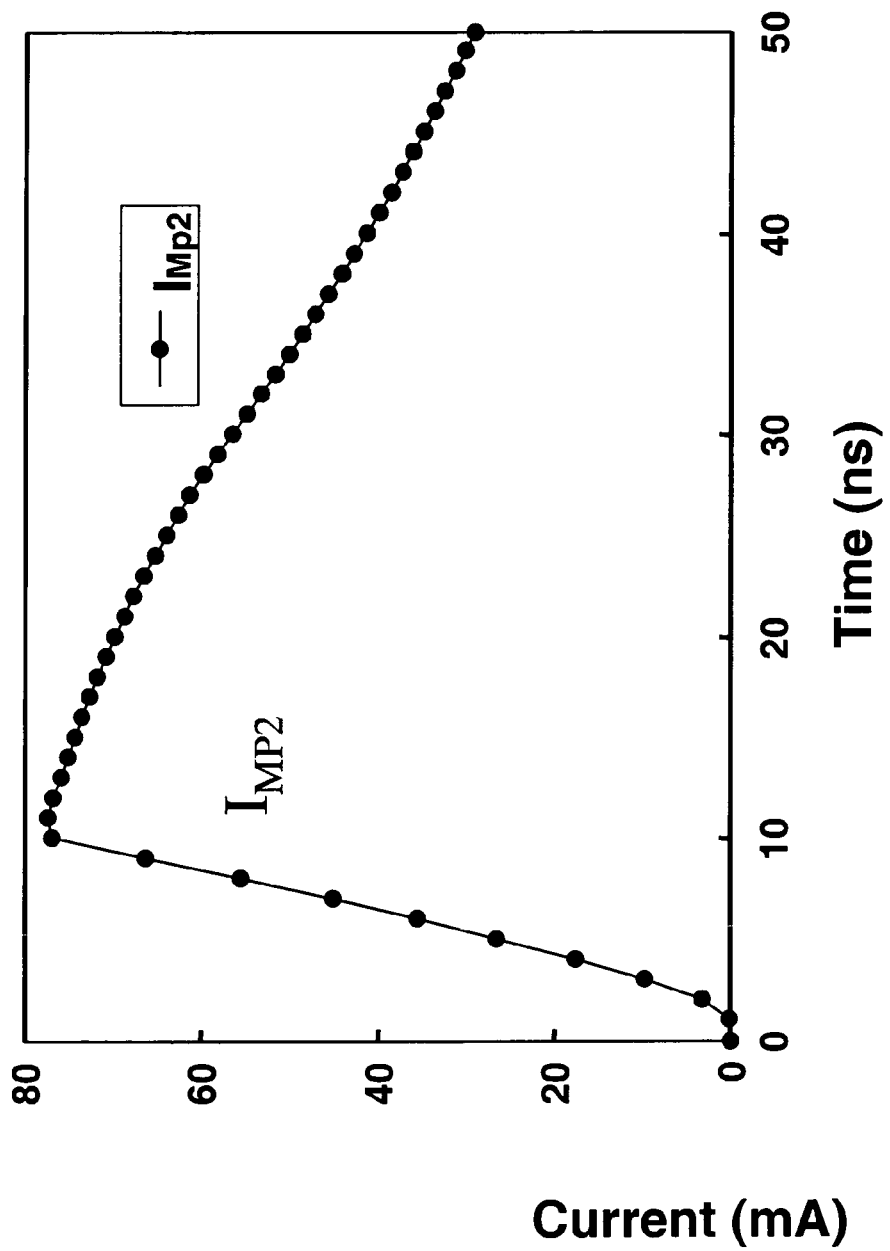

FIGS. 4A and 4B are plots illustrating the simulation results of the ESD clamp circuit 20 shown in FIG. 2 operating in response to an ESD event. In ESD detection circuit 22, according to one embodiment of the present invention, the channel width to channel length (W/L) ratios of the transistors $M_{P1}$, $M_{P2}$, $M_{P3}$ and $M_{N3}$ are approximately 30 (µm)/0.15 (µm), 30/0.15, 5/7.5 and 5/0.15, respectively, and the resistor $R_1$ is approximately 50K Ohms. Referring to FIG. 4A, a simulated signal $VDD_h$ of 6V with a rise time of 10 ns represents an ESD pulse occurring on the first power supply $VDD_H$. Due to an RC delay, Va does not rise so fast as the $VDD_h$ signal, which turns on the first PMOS transistor $M_{P1}$ and in turn ESD detection circuit 22. FIG. 4B illustrates a current response of the second PMOS transistor $M_{P2}$. Referring to FIG. 4B, a current $I_{MP2}$, which flows from the PMOS transistors $M_{P1}$ and $M_{P2}$ to the base of the STNMOS device, quickly rises during the first 10 ns as the ESD pulse rises.

Figure 5:
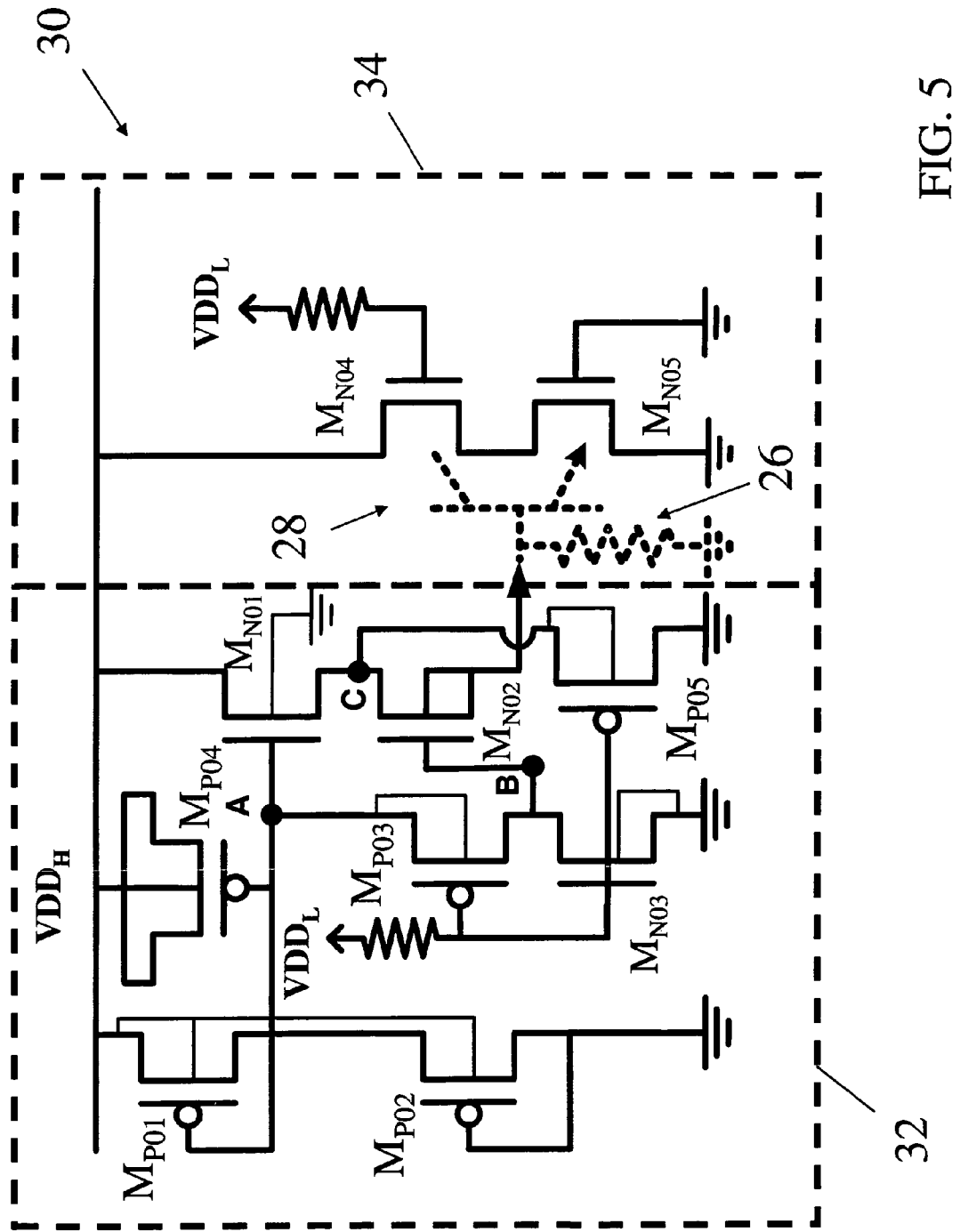
FIG. 5 is a circuit diagram of an ESD clamp circuit in accordance with another embodiment of the present invention.

FIG. 5 is a circuit diagram of an ESD clamp circuit 30 in accordance with A second embodiment of the present invention. Referring to FIG. 5, ESD clamp circuit 30 includes an ESD detection circuit 32 and an ESD protection circuit 34. ESD detection circuit 32 includes first, second, third and fourth PMOS transistors $M_{P01}$, $M_{P02}$, $M_{P03}$ and $M_{P04}$, and first, second and third NMOS transistors $M_{N01}$, $M_{N02}$ and $M_{N03}$. The first and second PMOS transistors $M_{P01}$ and $M_{P02}$ serve as a divider string to bias a point A to a portion of $VDD_H$. In the second embodiment, the first and second PMOS transistors $M_{P01}$ and $M_{P02}$ are fabricated to be the same size so that $V_A$ is approximately ½ $VDD_H$. During normal operations, since $VDD_L$ is equal to approximately ½ $VDD_H$, the third PMOS transistor $M_{P03}$, including a gate (not numbered) coupled to $VDD_L$, is turned off. The third NMOS transistor $M_{N03}$, including a gate (not numbered) coupled to $VDD_L$, is turned on. The voltage level at a point B. i.e., $V_B$, is pulled to a reference voltage level, which turns off the second NMOS transistor $M_{N02}$. The voltage level at a point C, i.e., $V_C$, is biased at approximately (½$VDD_H$–$V_{tn}$), where $V_{tn}$ is the threshold voltage of the first NMOS transistor $M_{N01}$. ESD detection circuit 32 is therefore kept at an off state during normal operations, and draws no current to ESD protection circuit 34.

In the second preferred embodiment, the first and second PMOS transistors $M_{P01}$ and $M_{P02}$ are designed to be a small size so as to prevent an excessive leakage current. In other embodiments of the invention, the divider string formed by the PMOS transistors $M_{P01}$ and $M_{P02}$ in the present example may be a number of four, six, eight or greater number of such PMOS transistors, to further suppress a leakage current.

The voltage level of $V_C$ may rise to exceed ½ $VDD_H$ if voltage oscillation due to noise on $VDD_H$ is coupled via the fourth PMOS transistor $M_{P04}$ to $V_A$. Such voltage rise may cause a gate oxide reliability issue on the second NMOS transistor $M_{N02}$. To avoid such a risk, ESD clamp circuit 30 further includes a fifth PMOS transistor $M_{P05}$ to clamp the voltage level of $V_C$ at $VDD_L$+$V_{tp}$, where $V_{tp}$ is the threshold voltage of the fifth PMOS transistor $M_{P05}$. The fifth PMOS transistor $M_{P05}$ is designed with to be a small size to ensure that most of an ESD triggering current is conducted through parasitic resistor 26 during an ESD event.

When an ESD event occurs on the $VDD_H$ power line, a portion of the ESD voltage is coupled to the gate of $M_{N01}$ via the fourth PMOS transistor $M_{P04}$, which quickly pulls high $V_A$, turning on the first NMOS transistor $M_{N01}$. During the ESD event, since $VDD_L$ is floating, the third PMOS transistor $M_{P03}$ is turned on and $V_B$ is pulled to approximately $V_A$, turning on the second NMOS transistor $M_{N02}$. A substrate-triggered current is provided to the base of the STNMOS device, $M_{N04}$ AND $M_{N05}$, which turns on ESD protection circuit 34 to conduct an ESD current via parasitic npn transistor 28 to ground.

Figure 6A:
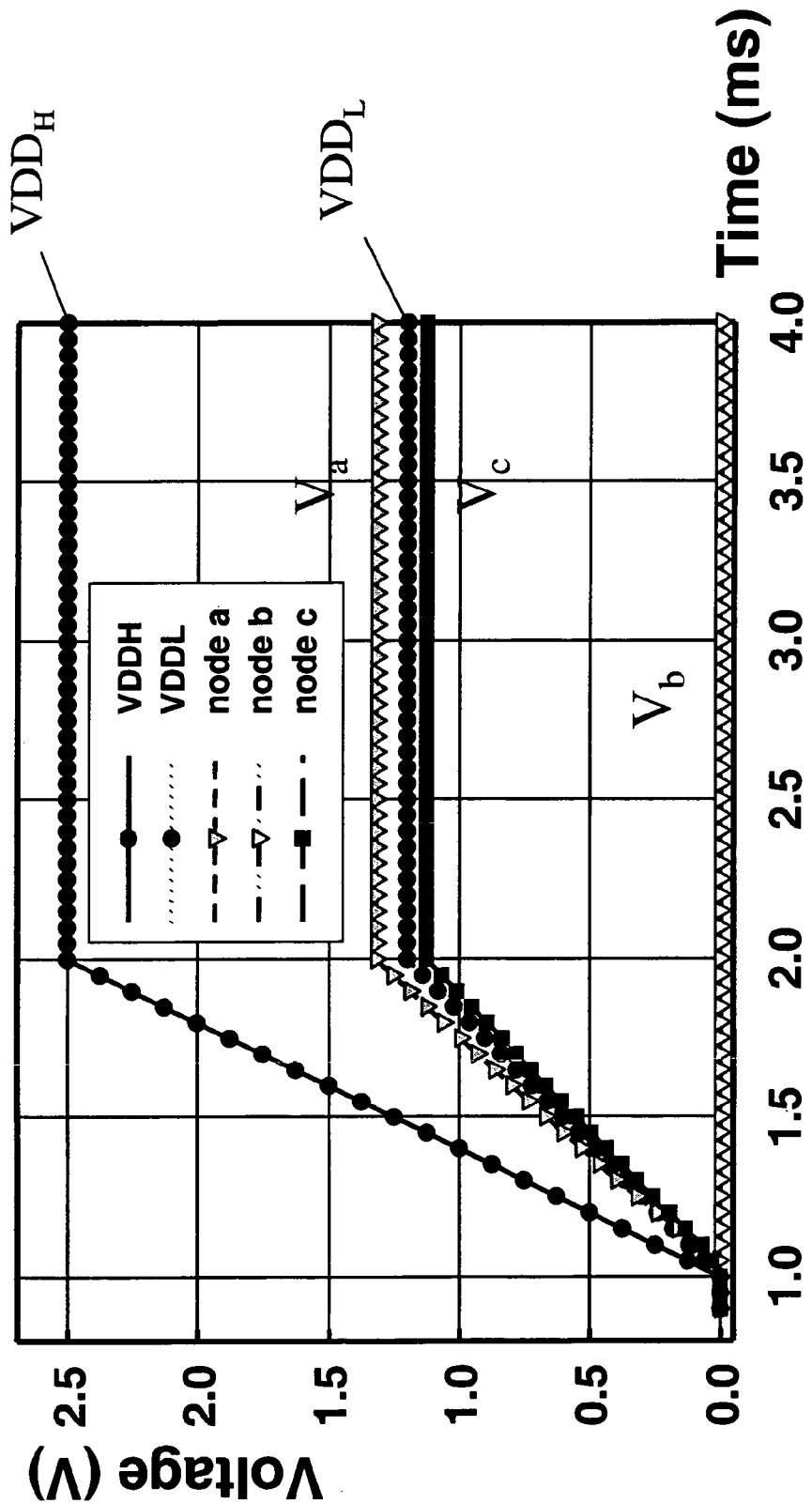
FIG. 6A is a plot illustrating the simulation results of the ESD clamp circuit shown in FIG. 5 operating at a normal condition.
Figure 6B:
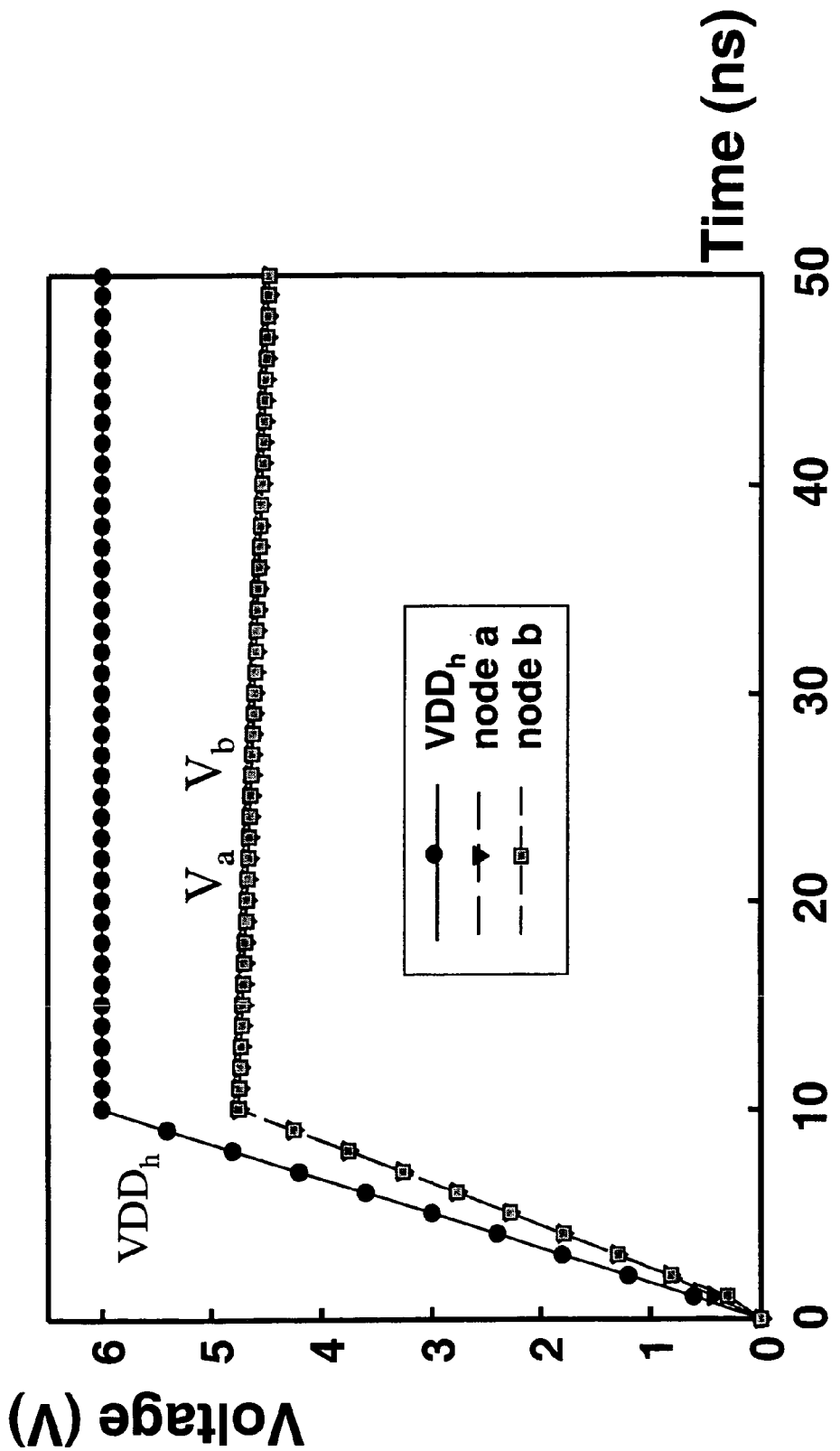
FIGS. 6B and 6C are plots illustrating the simulation results of the ESD clamp circuit shown in FIG. 5 operating in response to an ESD event.
Figure 6C:
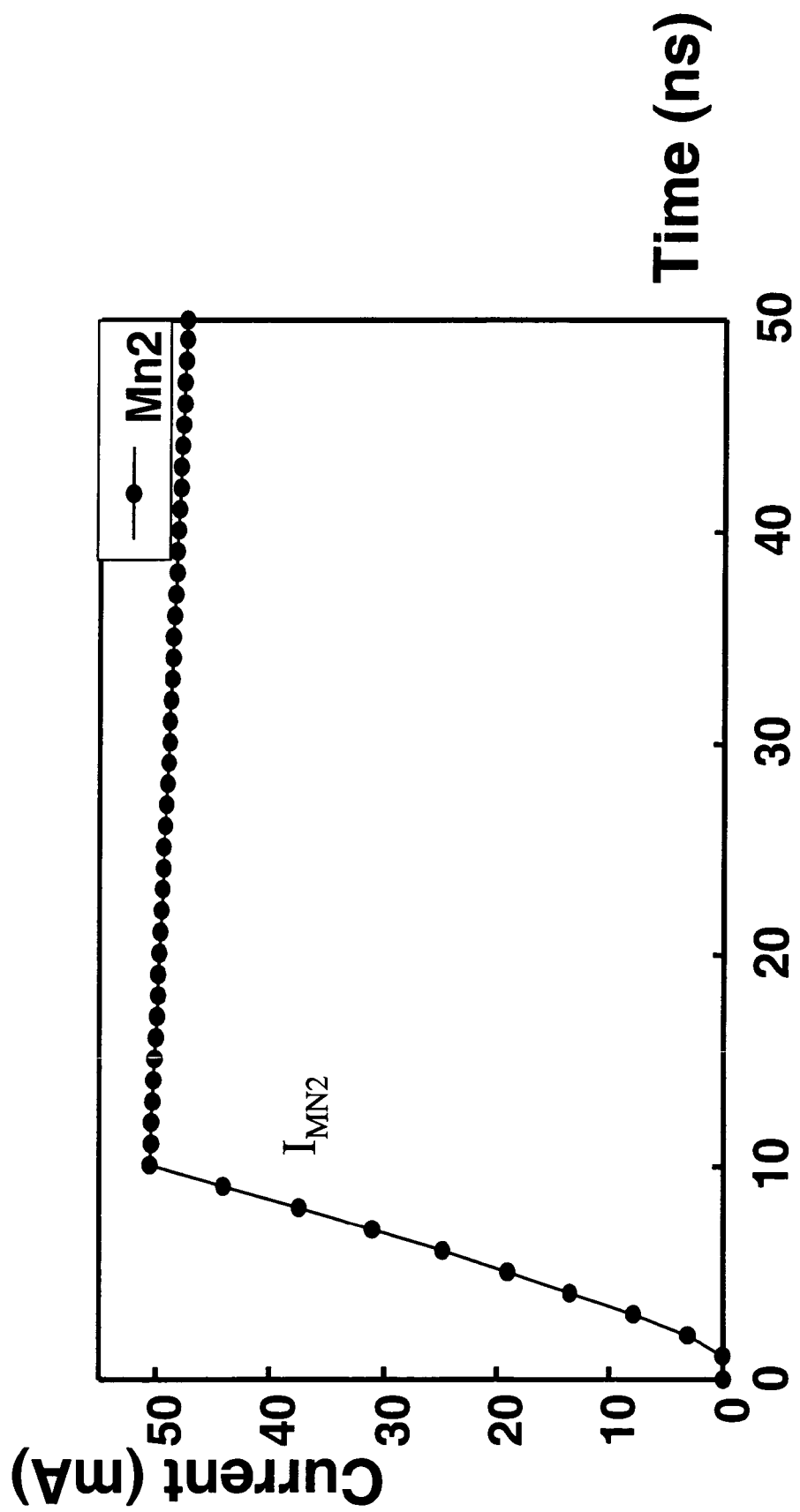

FIGS. 6A, 6B and 6C illustrate voltage or current responses in ESD clamp circuit 30, which are obtained by SPICE simulation. FIG. 6A is a plot illustrating the simulation results of the ESD clamp circuit 30 shown in FIG. 5 operating at a normal condition. Referring to FIG. 6A, simulated $VDD_H$ and $VDD_L$ signals have a value of approximately 2.5V and 1.2V, respectively, with a rise time of approximately 1 ms. The voltage $V_A$ and $V_C$ substantially rise to $VDD_L$ level in 1 ms during a power-on transition, and $V_B$ is kept at a reference voltage level.

FIGS. 6B and 6C are plots illustrating the simulation results of the ESD clamp circuit 30 shown in FIG. 5 operating in response to an ESD event. In ESD detection circuit 32, according to one embodiment of the present invention, the W/L ratios of the transistors $M_{P01}$, $M_{P02}$, $M_{P03}$, $M_{P04}$, $M_{N01}$, $M_{N02}$ and $M_{N03}$ are approximately 0.4 (μm)/20 (μm), 0.4/20, 10/0.15, 5/7.5, 30/0.15, 30/0.15 and 5/0.15, respectively. Referring to FIG. 6B, a simulated signal $VDD_h$ of 6V with a rise time of 10 ns represents an ESD pulse occurring on the $VDD_H$ power line. Due to a coupling effect, $V_A$ quickly rises to exceed $VDD_H$, which turns on the first NMOS transistor $M_{N01}$, the second NMOS transistor $M_{N02}$, and in turn ESD detection circuit 32. $V_B$ is substantially equal to $V_A$. FIG. 6C illustrates a current response of the second NMOS transistor $M_{N02}$. Referring to FIG. 6C, a current $I_{MN2}$, which flows from the NMOS transistors $M_{N01}$ and $M_{N02}$ to the base of the STNMOS device, quickly rises during the first 10 ns as the ESD pulse rises.

Figure 7A:
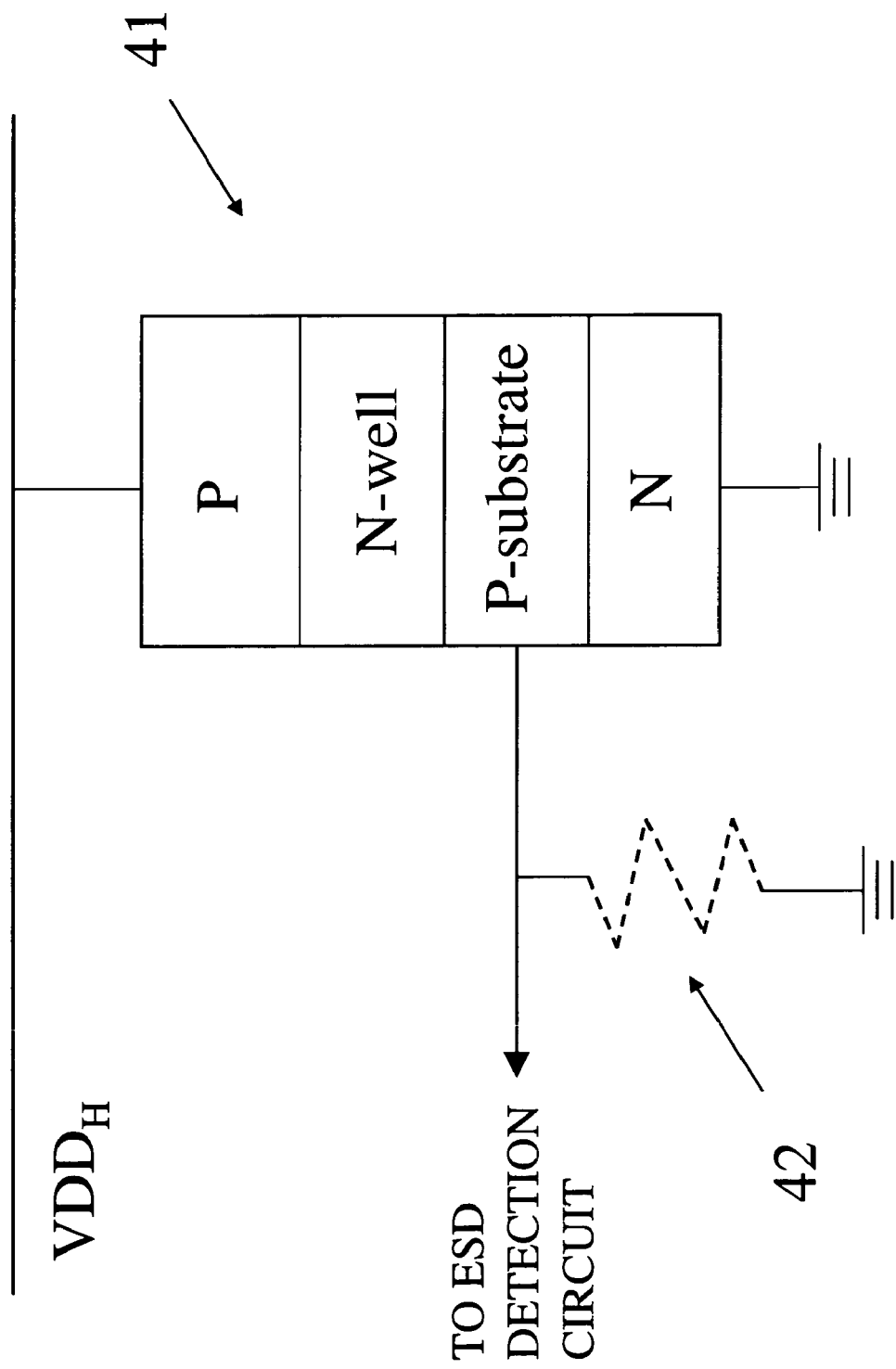
FIG. 7A is a schematic diagram of an ESD protection device in accordance with one embodiment of the present invention.

FIG. 7A is a schematic diagram of an ESD protection device in accordance with a third embodiment of the present invention. As previously discussed, suitable ESD protection circuits may include a silicon controlled rectifier ("SCR") device or a field oxide device ("FOD") in addition to an STNMOS device. Referring to FIG. 7A, the ESD protection device includes an SCR device 41 comprising a substrate (denoted as p-substrate) connected to an ESD detection circuit. In response to an ESD event, the substrate is triggered by a current provided from the ESD detection circuit, which turns on the ESD protection device. An ESD current is then conducted to ground via a parasitic resistor 42. Such an SCR device can be seen, for example, in U.S. Pat. No. 6,747,861 to Ker et al., entitled "Electrostatic Discharge Protection for a Mixed-Voltage Device Using a Stacked-Transistor-Triggered Silicon Controlled Rectifier".

Figure 7B:
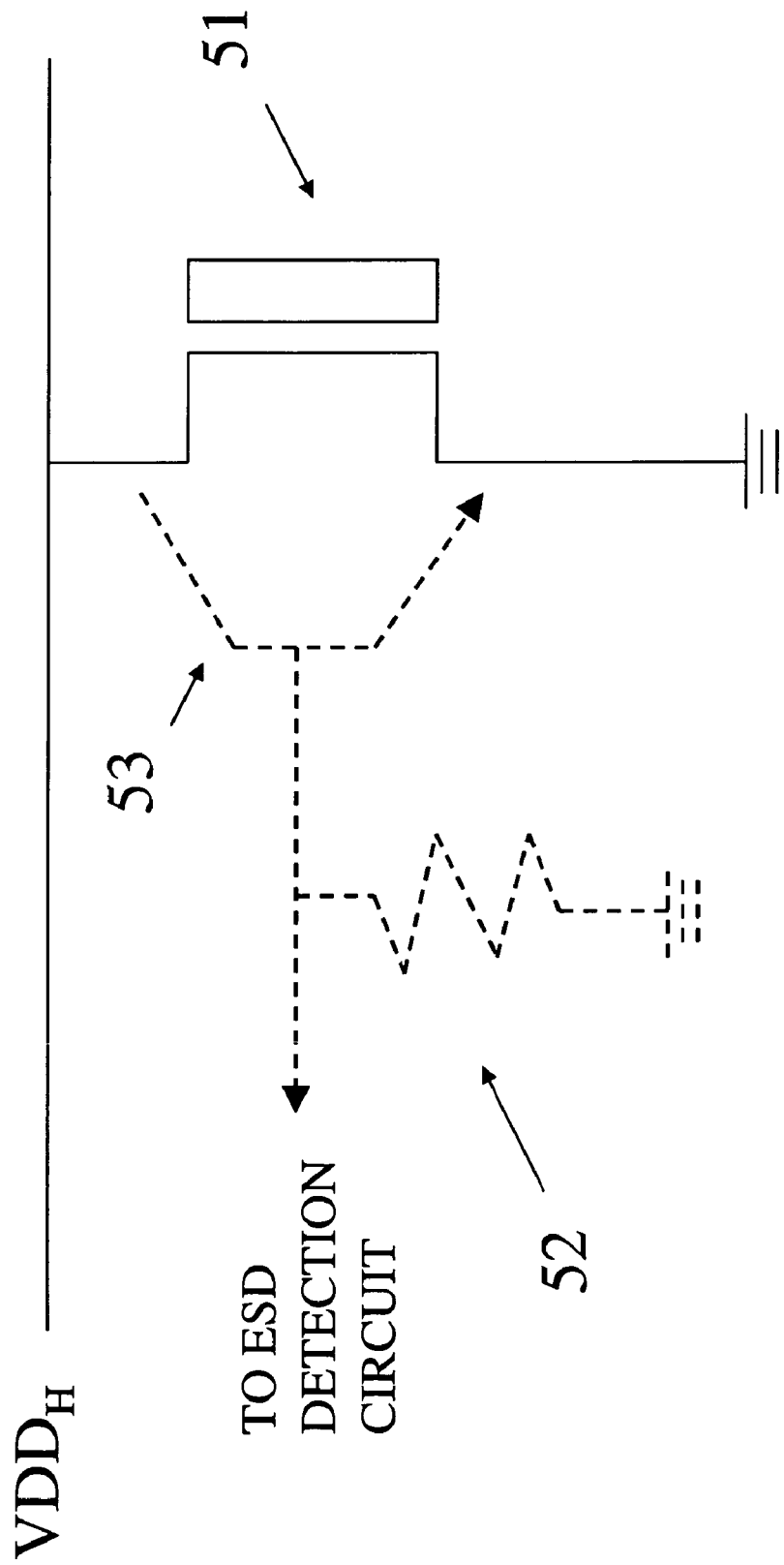
FIG. 7B is a schematic diagram of an ESD protection device in accordance with another embodiment of the present invention.

FIG. 7B is a schematic diagram of an ESD protection device in accordance with another embodiment of the present invention. Referring to FIG. 7B, the ESD protection device includes an FOD device 51 comprising a substrate (not numbered) connected to an ESD detection circuit. In response to an ESD event, the substrate is triggered by a current provided from the ESD detection circuit to the ground through the parasitic resistor 52, which turns on a parasitic npn transistor 53, and in turn the ESD protection device. An ESD current is then conducted to ground via the parasitic transistor 53. Such an FOD device can be seen, for example, in U.S. Pat. No. 5,744,842 to Ker, one of the inventors of the present application, entitled "Area-Efficient VDD-to-VSS ESD Protection Circuit".

Figure 8:
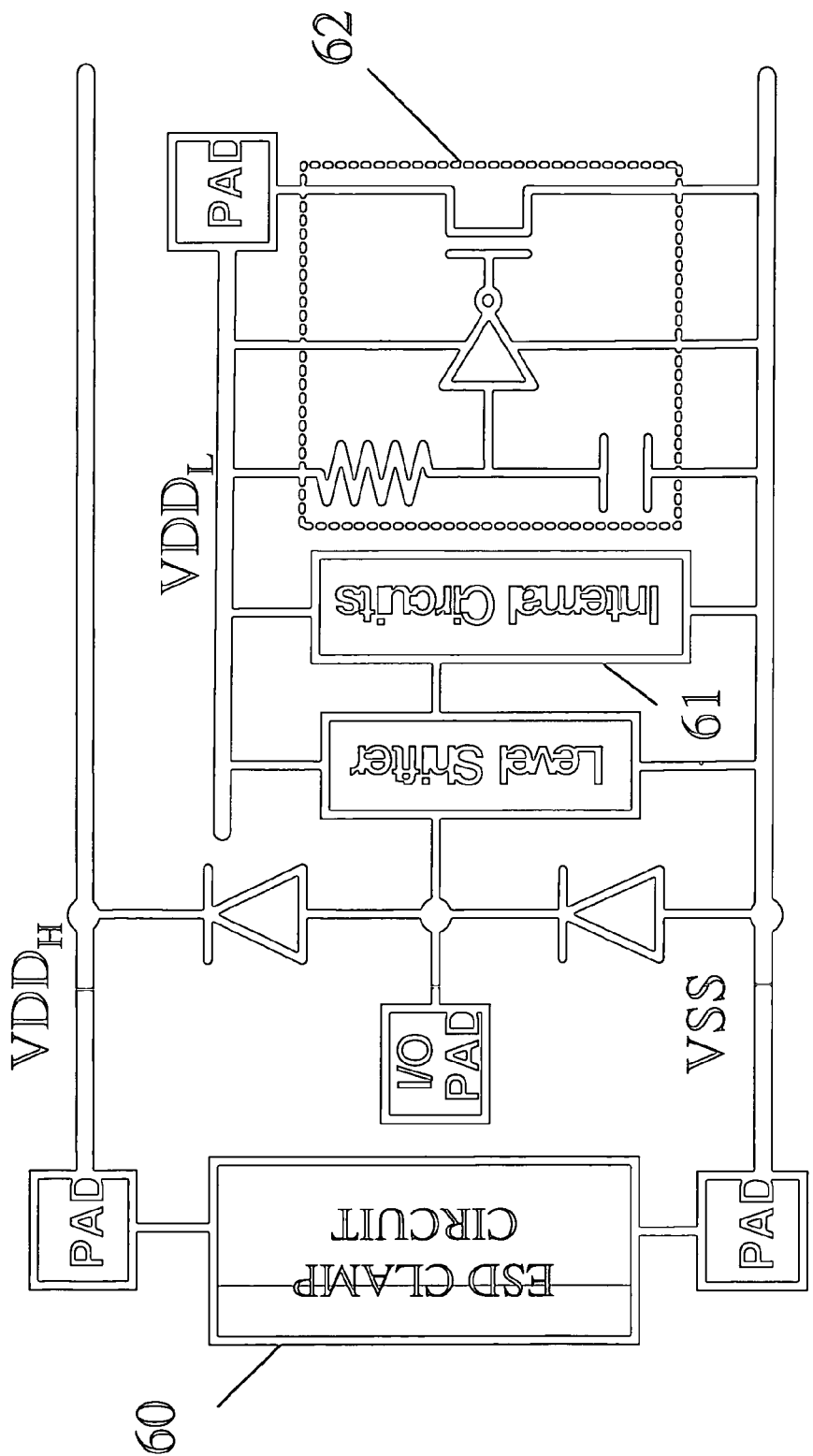
FIG. 8 is a schematic diagram illustrating a method for providing ESD protection in a mixed-voltage interface in accordance with one embodiment of the present invention.

FIG. 8 is a schematic diagram illustrating a method for providing ESD protection in a mixed-voltage interface in accordance with one embodiment of the present invention. Referring to FIG. 8, a first ESD clamp circuit 60, which has been discussed in the previous embodiments, is connected between the $VDD_H$ and the VSS lines for conducting an ESD current from the $VDD_H$ line to the VSS line in response to an ESD event occurring on $VDD_H$. A second ESD clamp circuit 62, connected in parallel with internal circuits 61 between the $VDD_L$ and the VSS lines is connected for conducting an ESD current from the $VDD_L$ line to the VSS line in response to an ESD event occurring on $VDD_L$.

It will be appreciated by those skilled in the art that changes could be made to the embodiments described above without departing from the broad inventive concept thereof. It is understood, therefore, that this invention is not limited to the particular embodiments disclosed, but it is intended to cover modifications within the spirit and scope of the present invention as defined by the appended claims.

Further, in describing representative embodiments of the present invention, the specification may have presented the method and/or process of the present invention as a particular sequence of steps. However, to the extent that the method or process does not rely on the particular order of steps set forth herein, the method or process should not be limited to the particular sequence of steps described. As one of ordinary skill in the art would appreciate, other sequences of steps may be possible. Therefore, the particular order of the steps set forth in the specification should not be construed as limitations on the claims. In addition, the claims directed to the method and/or process of the present invention should not be limited to the performance of their steps in the order written, and one skilled in the art can readily appreciate that the sequences may be varied and still remain within the spirit and scope of the present invention.

We claim:

1. A circuit for electrostatic discharge (ESD) protection, comprising:
   a voltage coupling device including a first terminal connected to a first power supply providing a first voltage;
   a first transistor including a gate connected to a second terminal of the voltage coupling device and a first terminal connected to the first power supply;
   a second transistor including a gate connected to a second power supply providing a second voltage smaller than the first voltage, and a first terminal connected to the gate of the first transistor;
   a third transistor including a gate connected to a second terminal of the second transistor, and a first terminal connected to a second terminal of the first transistor; and
   a fourth transistor including a gate connected to the second power supply, a first terminal connected to the gate of the third transistor, and a second terminal connected to a reference voltage different from the first voltage and the second voltage.

2. The circuit of claim 1, further comprising a voltage divider string connected between the first power supply and the reference voltage.

3. The circuit of claim 2, wherein the gate of the first transistor is connected to a terminal of the voltage divider string.

4. The circuit of claim 1, further comprising a fifth transistor including a gate connected to the second power supply and a first terminal connected to a second terminal of the first transistor.

5. The circuit of claim 1, further comprising a parasitic resistor formed between a second terminal of the third transistor and the reference voltage.

6. The circuit of claim 1, further comprising a parasitic transistor including a base connected to a second terminal of the third transistor.

7. The circuit of claim 1, further comprising a stacked n-type metal-oxide-semiconductor ("STNMOS") device connected between the first power supply and the reference voltage.

8. The circuit of claim 1, further comprising a silicon controlled rectifier ("SCR") device connected between the first power supply and the reference voltage.

9. The circuit of claim 1, further comprising a field oxide device ("FOD") connected between the first power supply and the reference voltage.

10. A method of providing electrostatic discharge (ESD) protection, comprising:
    providing a voltage coupling device including a first terminal connected to a first power supply providing a first voltage;
    providing a first transistor including a gate connected to a second terminal of the voltage coupling device and a first terminal connected to the first power supply;
    providing a second transistor including a gate connected to a second power supply providing a second voltage smaller than the first voltage, and a first terminal connected to the gate of the first transistor;
    providing a third transistor including a gate connected to a second terminal of the second transistor, and a first terminal connected to a second terminal of the first transistor;
    providing a fourth transistor including a gate connected to the second power supply, a first terminal connected to the gate of the third transistor, and a second terminal connected to a reference voltage different from the first voltage and the second voltage;
    forming a parasitic resistor between a second terminal of the third transistor and the reference voltage; and
    coupling a portion of an ESD pulse through the voltage coupling device to the first transistor in response to an ESD event.

11. The method of claim 10, further comprising conducting an ESD current from the first power supply to the reference voltage through the parasitic resistor.

12. The method of claim 10, further comprising:
    forming a parasitic transistor; and
    providing a current to a base of the parasitic transistor in response to an ESD event.

13. The method of claim 10, further comprising providing a fifth transistor including a gate connected to the second power supply and a first terminal connected to a second terminal of the first transistor.

14. The method of claim 10, further comprising:
    providing a voltage divider string connected between the first power supply and the reference voltage; and
    connecting the gate of the first transistor to a terminal of the voltage divider string.

* * * * *